United States Patent
Tsironis (10) Patent No.: US 12,052,008 B1
(45) Date of Patent: Jul. 30, 2024

(54) HYBRID HARMONIC SOURCE PULL TUNER SYSTEM

(71) Applicant: Christos Tsironis, Dollard-des-Ormeaux (CA)

(72) Inventor: Christos Tsironis, Kirkland (CA)

(*) Notice: Subject to any disclaimer, the term of this patent is extended or adjusted under 35 U.S.C. 154(b) by 292 days.

(21) Appl. No.: 16/509,936

(22) Filed: Jul. 12, 2019

(51) Int. Cl.
| | |
|---|---|
| H03H 11/28 | (2006.01) |
| G01R 27/28 | (2006.01) |
| G01R 31/26 | (2020.01) |
| G01R 31/28 | (2006.01) |
| G01R 35/00 | (2006.01) |
| H01P 3/02 | (2006.01) |

(52) U.S. Cl.
CPC ............ *H03H 11/28* (2013.01); *G01R 27/28* (2013.01); *G01R 31/2607* (2013.01); *G01R 31/2822* (2013.01); *G01R 35/005* (2013.01); *H01P 3/02* (2013.01)

(58) Field of Classification Search
CPC ...... H03H 11/28; G01R 27/28; G01R 35/005; G01R 31/2822; G01R 31/2607; H01P 3/02
See application file for complete search history.

(56) References Cited

U.S. PATENT DOCUMENTS

| | | | |
|---|---|---|---|
| 7,135,941 B1 | 11/2006 | Tsironis | |
| 7,282,926 B1* | 10/2007 | Verspecht | G01R 27/32 324/637 |
| 9,331,670 B1 | 5/2016 | Mahmoudi et al. | |
| 10,187,228 B1 | 1/2019 | Tsironis | |
| 2001/0024117 A1* | 9/2001 | Kiyokawa | G01R 31/2603 324/76.49 |
| 2013/0321092 A1* | 12/2013 | Simpson | G01R 27/00 333/17.3 |

OTHER PUBLICATIONS

Load Pull, online, Wikipedia [Retrieved on Nov. 18, 2016]. Retrieved from Internet <URL: http://en.wikipedia.org/wiki/Load_pull>.
"Computer Controlled Microwave Tuner, CCMT", Product Note 41, Focus Microwaves Inc., Jan. 1998, pp. 2-4.
"MPT, a universal Multi-Purpose Tuner", Product Note 79, Focus Microwaves, Oct. 2004.
Takayama, Y. "A new load-pull characterization method", 1976 IEEE-MTT-Symposium, pp. 218-220.
Broadband RF & Microwave Amplifiers [online], SHF Communication Technologies AG [retrieved on Jun. 13, 2019]. Retrieved from Internet <URL: https://www.shf-communication.com/products/rf-broadband-amplifiers/>.
What is a Vector Network Analyzer, VNA: the basics [online], electronics notes, [retrieved on Jun. 13, 2019]. Retrieved from Internet <URL: https://www.electronics-notes.com/articles/test-methods/rf-vector-network-analyzer-vna/what-is-a-vna.php>.

* cited by examiner

Primary Examiner — Akm Zakaria (57) ABSTRACT

A hybrid, active-passive, harmonic source pull tuner system employs the Gamma Boosting Unit (GBU) concept and associated calibration and monitoring algorithms to allow for real source pulling operation. The GBU concept itself does not provide knowledge of the source impedance without proper calibration and monitoring. The hybrid tuner system includes a single or multi-probe source tuner and adjustable coupling allowing steering the impedance to the optimum device matching area.

5 Claims, 13 Drawing Sheets

HYBRID HARMONIC SOURCE PULL TUNER SYSTEM

PRIORITY CLAIM

Non applicable.

CROSS-REFERENCE TO RELATED ARTICLES

1. Load Pull [online] Wikipedia [Retrieved 2016-11-18] Retrieved from Internet <URL: http://en.wikipedia.org/wiki/Load_pull>
2. "Computer Controlled Microwave Tuner, CCMT", Product Note 41, Focus Microwaves Inc. 1998, pages 2-4.
3. "MPT, a universal Multi-Purpose Tuner", Product Note 79, Focus Microwaves, October 2004
4. Takayama, Y. "A new load-pull characterization method", 1976 IEEE-MTT-Symposium, pp 218-220.
5. Simpson, G., US 2013/0321092, "Hybrid active tuning system and method," FIGS. 9, 16, 18.
6. Mahmoudi R. et al, U.S. Pat. No. 9,331,670, "Gamma Boosting Unit (GBU) for hybrid Load and Source Pull".
7. Verspecht et al. U.S. Pat. No. 7,282,926: "Method and an apparatus for characterizing a high-frequency device-under-test in a large signal impedance tuning environment".
8. Broadband RF & Microwave Amplifiers [online], SHF Communication Technologies AG [retrieved on 2019-06-13]. Retrieved from Internet <URL: https://www.shf-communication.com/products/rf-broadband-amplifiers/>.
9. What is a Vector Network Analyzer, VNA: the basics [online], electronics notes, [retrieved on 2019-06-13]. Retrieved from Internet <URL: https://www.electronics-notes.com/articles/test-methods/rf-vector-network-analyzer-vna/what-is-a-vna.php>.
10. Tsironis, C., U.S. Pat. No. 7,135,941, "Triple probe automatic slide screw tuner"
11. Tsironis, C., U.S. Pat. No. 10,187,228, "Integrated split signal hybrid harmonic tuner", FIG. 5.

BACKGROUND OF THE INVENTION AND PRIOR ART

This invention relates to "controlled non-50Ω" (Load or Source Pull) testing of microwave devices and transistors (DUT) (see ref. 1). Load/Source pull is the method by which the load or source impedance presented to the DUT at a given frequency is changed systematically and the DUT performance is registered, with the objective to map the DUT response and find an optimum, depending on the overall design objectives. This may be maximum power, gain, efficiency, linearity or else. The impedance is controlled using impedance tuners (see ref. 2).

Figure 1:
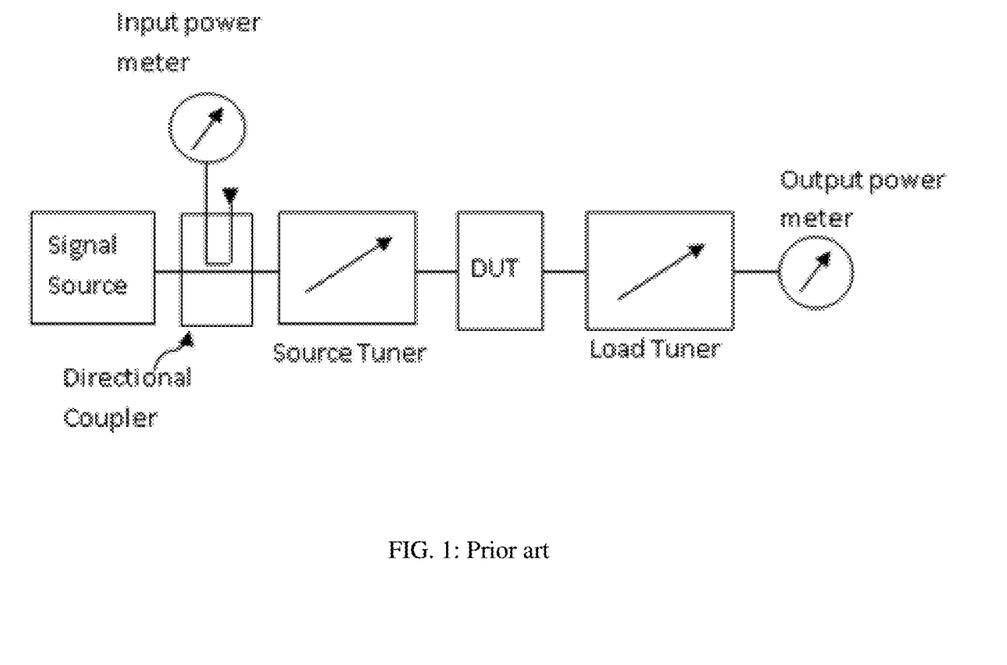
FIG. 1 depicts prior art, a typical scalar load/source pull test system using passive tuners.

A load/source pull test system is shown in FIG. 1. It comprises a signal source, source (input) and load (output) impedance tuners, a device under test (DUT, transistor) in a test fixture (the DUT can also be a micro-chip on a semiconductor wafer accessed using microscopic wafer probes) and input and output measurement instruments. The instruments can measure power, DC bias and various spectral components, generated either by the source or by the non-linearities of the DUT. The tuners and the instruments are controlled by a PC controller (not shown) using test software and appropriate digital communication protocols (GPIB, RS 232, LAN etc.). The data acquired by the test software comprise RF and DC response of the DUT to input stimulus for given source and load impedances. This data is saved in load pull files and serve to a) qualify the DUT and b) design optimum matching networks for given target performance, this being output power, linearity, efficiency etc. In general laboratory jargon, the expression load-pull includes the notion of source-pull.

Passive slide-screw tuners (see ref. 2) are the standard technology used in the industry for non-50Ω measurements. They are made using a low loss slotted airline (slabline) and metallic, wideband reflective probes insertable into the slabline channel, coupled capacitively with the center conductor and moved in-out and along the slabline to create an amplitude and phase controllable reflection factor. Those tuners have, frequency dependent, the inherent limitation of up to a maximum reflection factor |Γ|<0.95 at the tuner reference plane; transferred to the DUT reference plane the reflection factor is lower, due to interfering adapter, cable and test fixture insertion loss. Beyond this limitation, multi-probe electro-mechanical passive tuners can control independently, over multiple frequency octaves, the reflection factor not only at one, but at more, typically up to three, harmonic frequencies (see ref. 3) simultaneously. To overcome the tuning range limitation of the magnitude of the reflection factor at the DUT reference plane, the only alternative is using active tuners (see ref. 4). However, active tuners are mostly limited to fundamental frequency (fo) operation. To make active tuners with harmonic impedance control one must use additional external signal sources, a cumbersome and rather expensive solution (see ref. 5). Active tuners use amplifiers to enhance and re-inject coherent signal into the DUT; amplifiers have, typically, a 50Ω output impedance; this creates a large power mismatch with the low impedance of the DUT (1-2Ω) and requires pre-matching techniques (see ref. 6) leading to hybrid (active plus passive) tuning solutions.

BRIEF SUMMARY OF THE INVENTION

This invention discloses a wideband hybrid (active plus passive) source pull tuner (see FIG. 2) overcoming the above shortcomings: a) it uses active loop injection to overcome the tuning range limitation; b) it uses wideband multi-carriage harmonic tuners (see ref. 10) and wideband amplifiers (see ref. 8) to create harmonic feed-forward power injection and assisted harmonic pre-tuning control; the use of adjustable wave-probe signal coupler to sample the signal for the active feed-forward loop ads a needed degree of freedom to direct the active tuning towards the area of best performance of the DUT and optimize the amount of sampled signal power and gain of the loop. The invention discloses more than a hybrid impedance tuner, it discloses a hybrid tuning system that allows full source pull operations, i.e. allows mapping the DUT performance over the entire source reflection factor area. This requires explicit hybrid source tuner calibration methodology resulting into a calibrated harmonic hybrid (active-passive) source pull tuner, a device that has not been reported before.

DETAILED DESCRIPTION OF THE DRAWINGS

The invention and its mode of operation will be better understood from the following detailed description when read with the appended drawings in which.

DETAILED DESCRIPTION OF THE INVENTION

Figure 2:
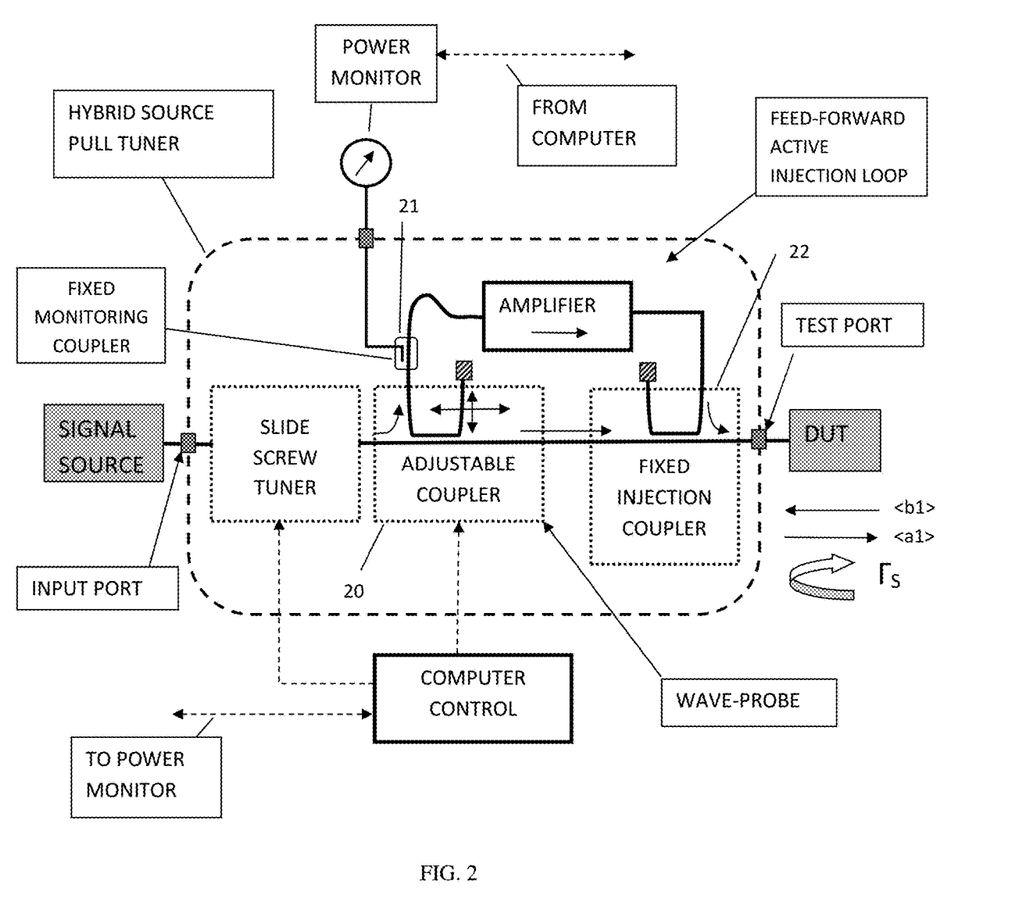
FIG. 2 depicts the basic configuration of the hybrid source pull tuner.
Figure 3:
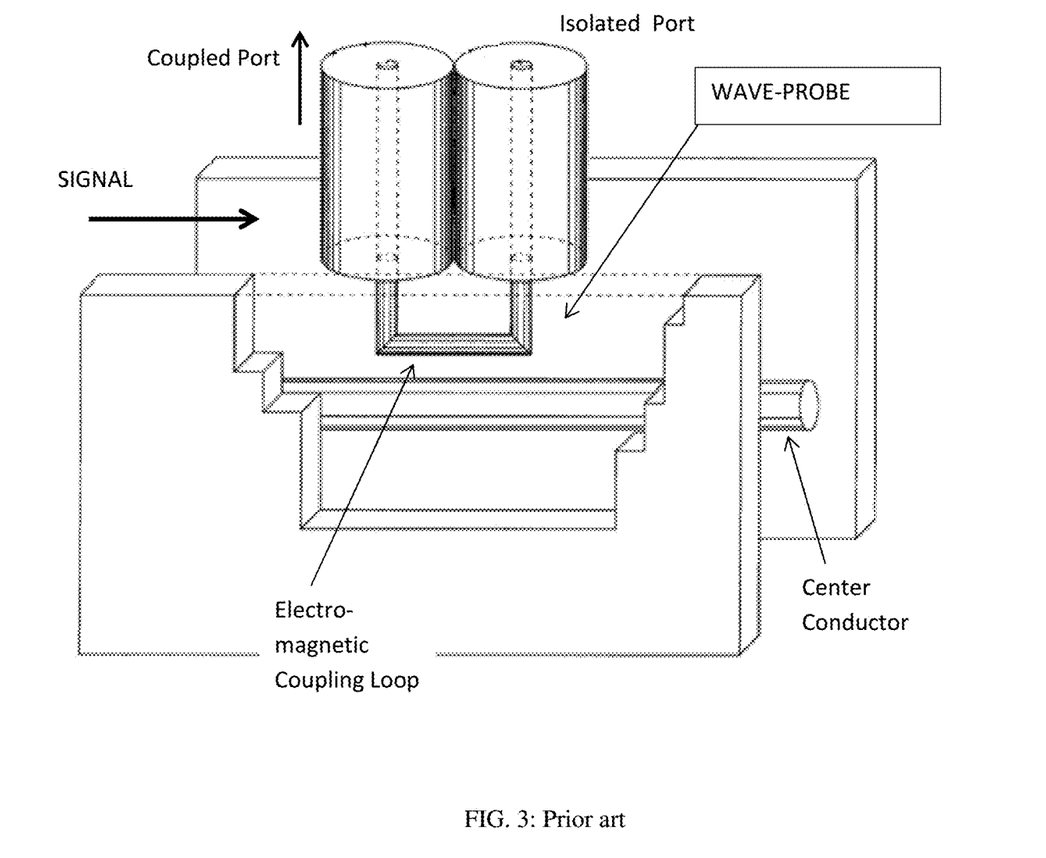
FIG. 3 depicts prior art, the perspective 3D view of a cut through a "wave-probe" type signal coupler.
Figure 10:
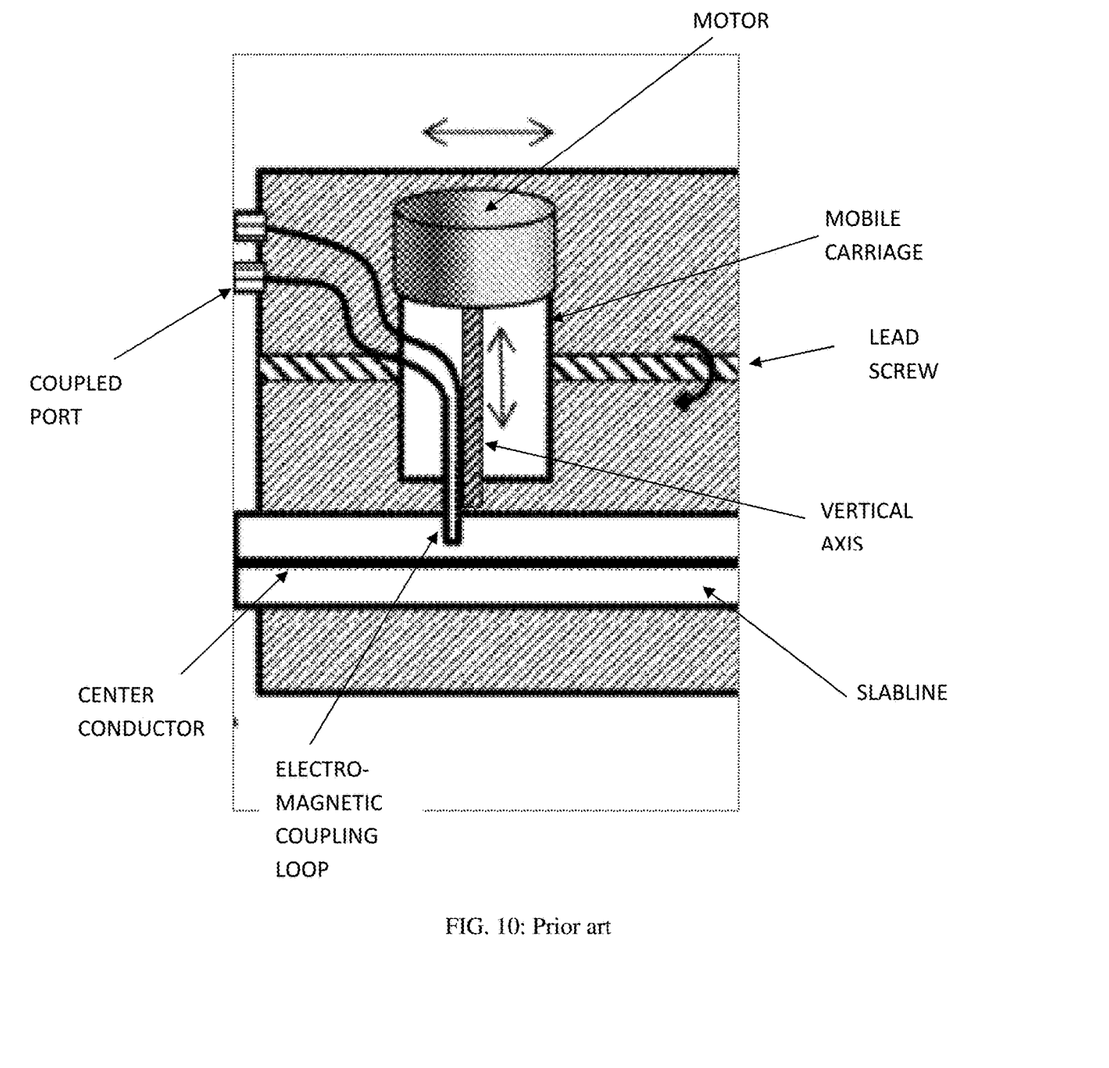
FIG. 10 depicts prior art, structure of adjustable wave-probe (see ref. 11).
Figure 11:
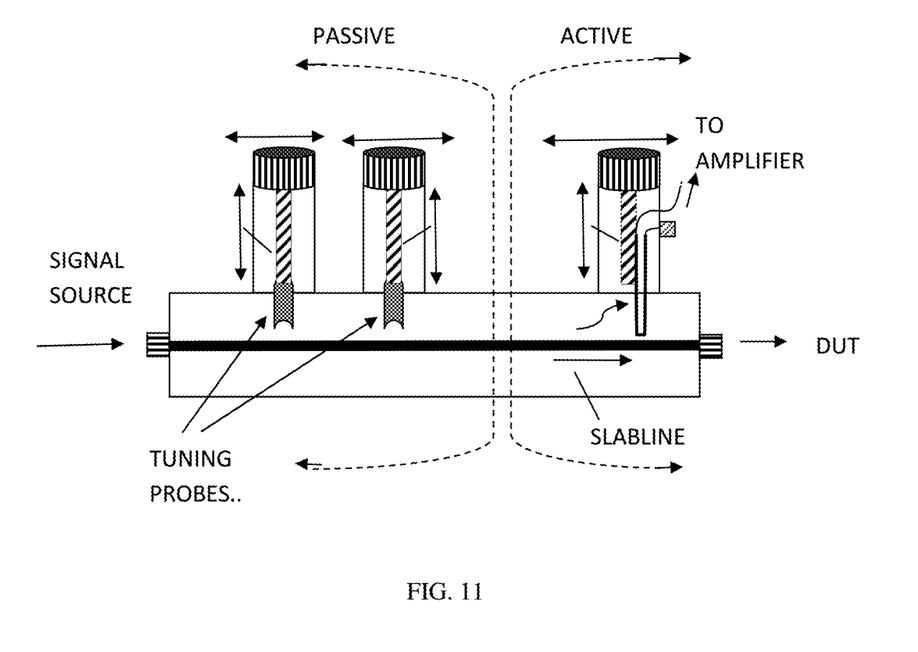
FIG. 11 depicts adjustable coupler (wave-probe) integrated in the slabline of a source slide screw tuner.

A source pull tuner is more than a source tuner. A source tuner allows more or less efficient power matching the DUT to the signal source; this can be verified by measuring and maximizing the gain of the DUT. A source tuner alone does not allow investigating the effect of the source impedance on the gain, efficiency or else of the device, except if the tuner is calibrated There is no way, even using the test setup of FIG. 7, to measure the source impedance (i.e. the impedance looking into the source: $\Gamma_S$) "in situ"; the setup of FIG. 7 allows measuring the input impedance of the DUT ($\Gamma_{IN}$) and the load impedance ($\Gamma_{LOAD}$), but not the source impedance; hence the importance of tuner calibration, i.e. the registration of impedances as a function of tuner states and retrieval during source pull. The concept of the harmonic hybrid source pull tuner is shown in FIG. 2: it includes an electro-mechanical (automatic) slide screw tuner, which can be single probe fundamental or multi-probe harmonic tuner (see ref. 2 and 3), an adjustable signal coupler that is typically made as a wave-probe, which can be a separate unit or integrated into the slabline of the slide screw tuner, a monitoring coupler to observe the injected power into the amplifier and to allow deciding about the linearity of the amplifier and by consequence the validity of the calibration (FIG. 6) and a power amplifier, followed by a fixed injection coupler, which allows power to be added to the signal injected into the DUT. As already stated, the slide screw tuner and the wave-probe can be part of the same tuner body (FIG. 11), and be controlled by the same controller, since the adjustable wave-probe is made using a magnetic loop (FIG. 3) attached to the vertical axis of a mobile carriage operating the same as the other carriages of the tuner (FIG. 10).

Figure 5:
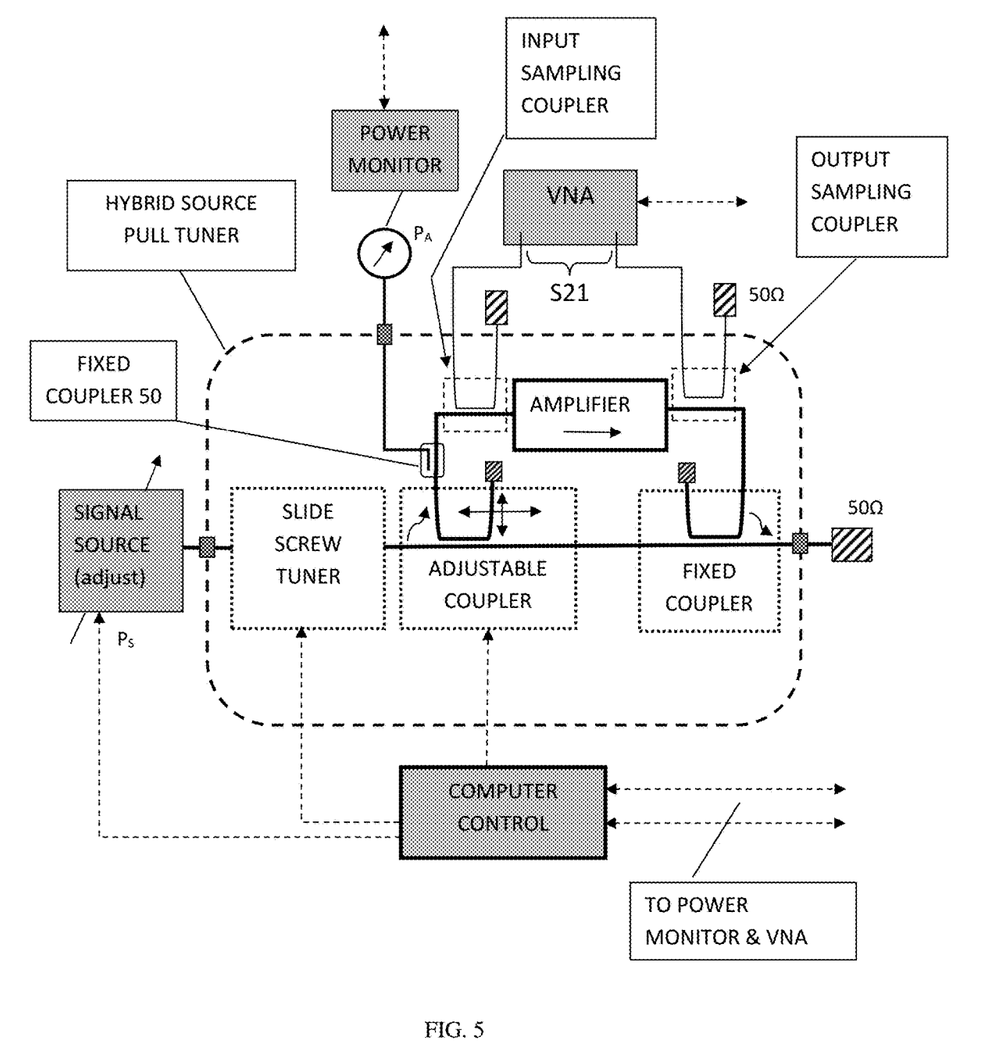
FIG. 5 depicts detailed structure of the hybrid source pull tuner.

In the setup of FIG. 5 signal coming from the signal source enters the hybrid source pull tuner at the input port and traverses the slide screw tuner which transforms the internal, typically 50Ω, impedance of the signal source into a user defined impedance; part of the signal power exiting from the slide screw tuner is coupled by the first (adjustable) coupler into the feed-forward active injection loop, which includes the three couplers 20, 21 and 22 (FIG. 2) and the amplifier. The remaining signal power travels towards the DUT. The horizontal and vertical adjustability of the first coupler 20 (wave-probe) ensures that the amount of coupled power and its phase, can steer the reflection factor, seen by the DUT at the test port, in the proper direction.

Figure 7:
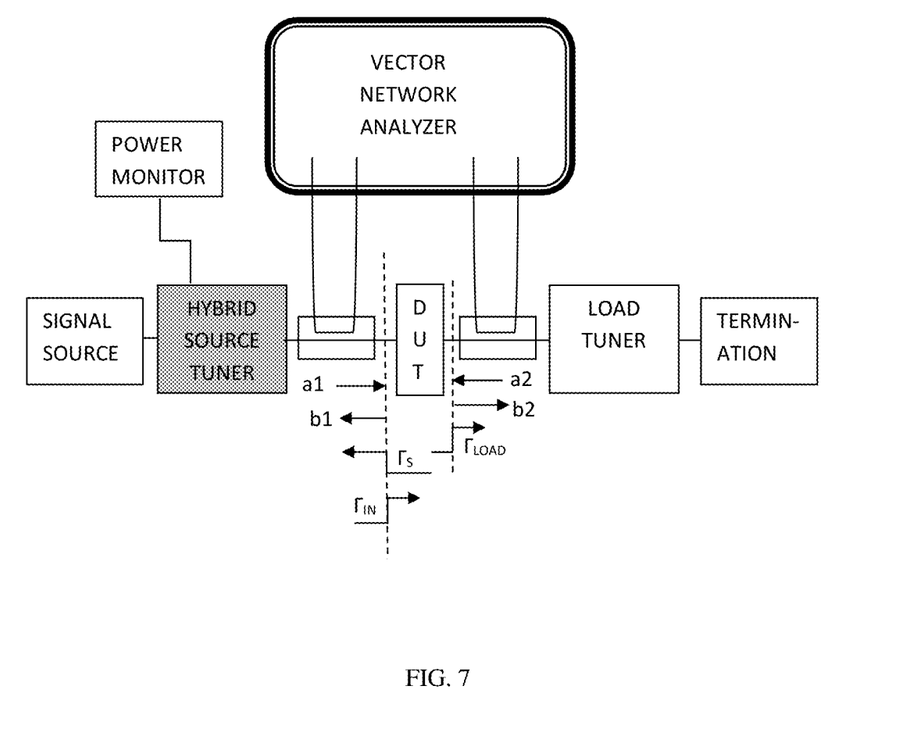
FIG. 7 depicts setup for measuring power waves in a source and load pull setup using hybrid source tuner.

The signal power exiting from the amplifier is forward-injected into the main transmission line and, phase-corrected, added to the original signal coming from the signal source. Even though there is little, or no power being injected by the DUT towards the signal source (the signal flow is from the signal source to the DUT) the source impedance (reflection factor) exists. It is the ratio of signal power <b1> injected into the tuner test port divided by the returned power <a1>: $\Gamma_S$=<a1>/<b1> (FIG. 7). This relation is the basis of the subsequent tuner calibration.

Figure 6:
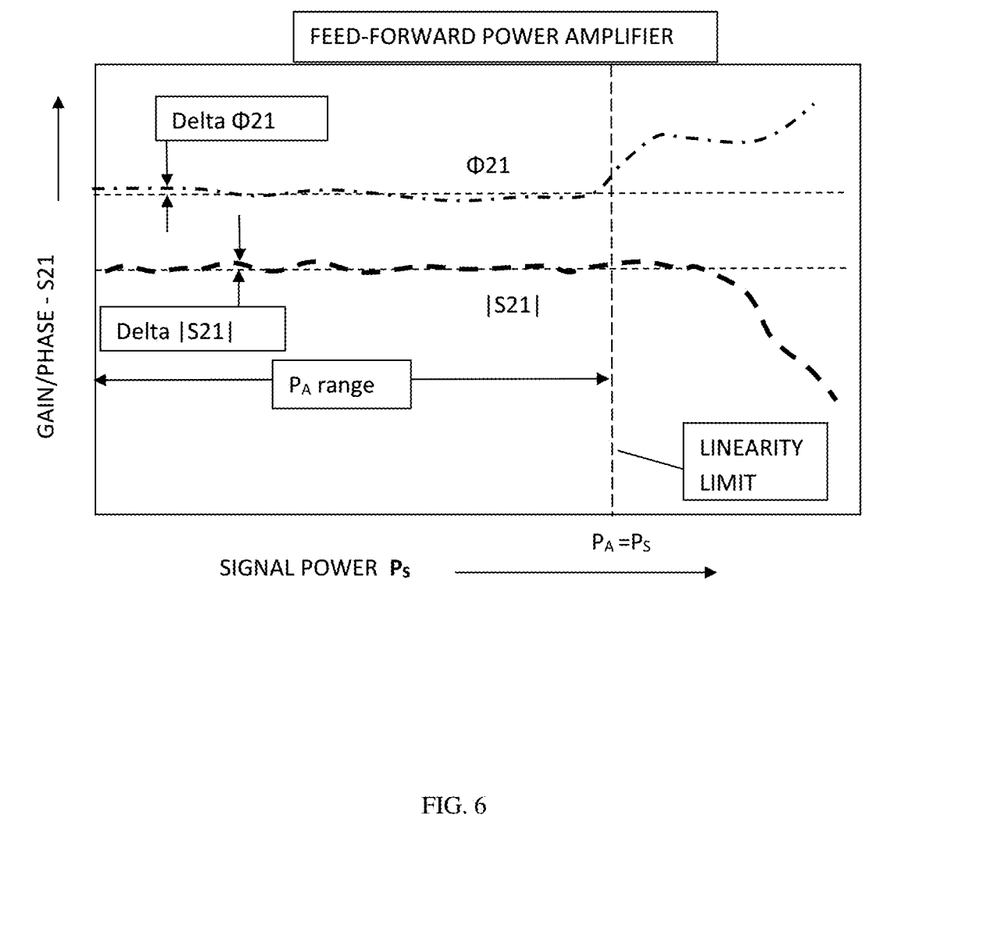
FIG. 6 depicts definition and behavior of calibration validity and tolerance.

Tuner calibration is important to be able to "tune to" (synthesize) a user defined impedance and extract correct information about the DUT during the measurement as a function of the source impedance. "Tuning" is the process of finding and setting the appropriate impedance to be presented to the DUT. There is always a "search and find" process involved. Either one "tunes" a radio by turning a knob, listening to the station and adjusting for the volume, or by synthesizing the right frequency numerically or, as in our case, by searching in the calibration data base and finding the right tuner settings, the algorithm is always the same. The difference is the time it takes. If the search occurs electronically, it is fast. If it is mechanical, it is slow. Since the tuners used here are mechanical, we cannot afford a real-time "search and find" algorithm, the search has to be executed electronically or numerically in computer processor. Therefore, we need the tuners to be pre-calibrated, the data to be saved in a data-base and the tuning search to be executed afterwards electronically in computer memory, before moving the mechanical tuner parts (tuning probes) to the numerically identified positions. In this case, obviously, the validity of the calibration data is primordial. Mechanical tuners can be made with vector tuning accuracies exceeding 0.1%, defined as the vector difference between target and synthesized reflection factor: $\Delta\Gamma=|\Gamma\cdot target-\Gamma\cdot measured|^2$ {eq.1}. This is because mechanical tuners are linear, i.e., up to a certain injected RF+DC power, their behavior does not change. Depending on frequency this can be from a few Watts to a few hundreds of Watts, which, for testing semi-conductor test objects (transistors), is enough, i.e. we can saturate the DUT before the tuner changes and the calibration becomes invalid. However, if the tuner is partly or entirely "active", i.e. if it includes an amplifier, then the validity of the calibration at increased power is not guaranteed. It depends on the amplifier. If the RF power injected into the amplifier exceeds a threshold, the amplifiers start compressing and their performance (gain and transmission phase) change (FIG. 6). This condition may happen at any time during the operation and falsify the measurement. The linearity of the amplifier must therefore be monitored during the operation. In the proposed setup this is done using a fixed signal monitoring coupler 21 (FIG. 2) attached to a remotely accessible power monitor, typically a programmable power meter.

The calibration data base is generated at low power. The detectors of vector network analyzers (see ref. 9) operate at a few Milliwatt. The validity of the calibration must be checked for high power as well. This is not possible using the VNA as a signal source. It must be done using a specific setup, as shown in FIG. 5; herein a set of sampling couplers must be inserted in front and after the amplifier to allow measuring its gain and phase as a function of injected power, the VNA measurement does not need to be absolute, because the only point of interest is the change of the gain and phase of the amplifier, not the exact values (FIG. 6). Also, while the injected power is controlled by the signal source, the important reference is the monitored power $P_A$ which defines the allowed operation power range $P_A$. The range is limited by either a gain change or a transmission phase change whatever happens first, because either will falsify the calibration. It is assumed that a small signal tuner calibration is valid within the $P_A$ range. During this operation the test port of the tuner is terminated with 50Ω to avoid returned signal power and interferences.

Figure 8:
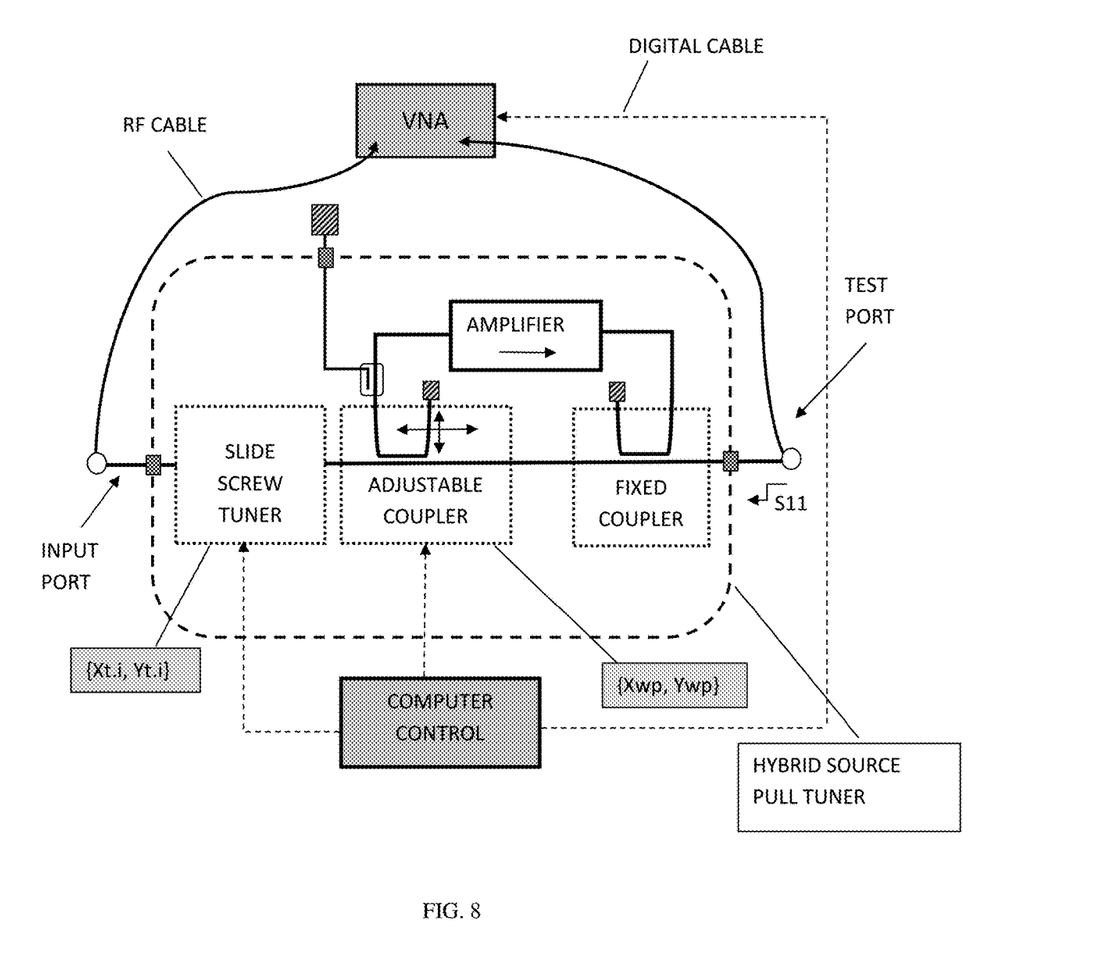
FIG. 8 depicts setup for calibrating the harmonic hybrid source pull tuner.

The tuner calibration itself can be executed without the use of the sampling couplers (FIG. 8), which may or may not be removed physically. The VNA is connected between the input port and the test port of the hybrid tuner and scattering (s-) parameters are measured at all test frequencies fo, and harmonic frequencies 2fo and 3fo. The s-parameters are, in general, measured at low power (in the mW range), in order to protect the sensitive VNA detectors. The calibration stimuli are the horizontal and vertical positions (Xt.i,Yt.i) of the tuning probes "i" (1=1,2 or 3) of the slide screw tuner and the horizontal and vertical positions (Xwp,Ywp) of the magnetic coupling loop of the adjustable coupler (wave-probe). Depending on the positions and number of tuning probes and the positions of the coupling loop, the permutations are very large. It is therefore, timely, impossible to calibrate all permutations individually; as an example, if the slide screw tuner has two probes, each having a moderate 500 states (100 horizontal and 5 vertical positions) and the coupling loop has another 50 positions (10 horizontal and 5 vertical) then the total permutations amount to 500×500×50=1,250,000 states, a timely impossible task. Instead we use the de-embedding calibration (see ref. 10), which allows reducing the above number to 500+500+50=1050 states, a reasonable measuring procedure, assuming one measurement lasts typically 2-5 seconds. In the case of a three-probe tuner the situation is far more time demanding: 1550 de-embedded versus 625,000,000 raw states. For performing this calibration, specific rules for processing the data apply: the two-port s-parameters associated with the position of each probe are measured individually (i.e. with all remaining probes withdrawn) and de-embedded with (cascaded with the inverse of) the initialization matrix of the tuner, i.e. the s-parameters of the tuner with all probes withdrawn; only s-parameters associated with the probe closest to the test port are not de-embedded; then all matrix permutations are cascaded in memory. This method is the key allowing meaningful use of multi-probe tuners and wave-probes.

Figure 4:
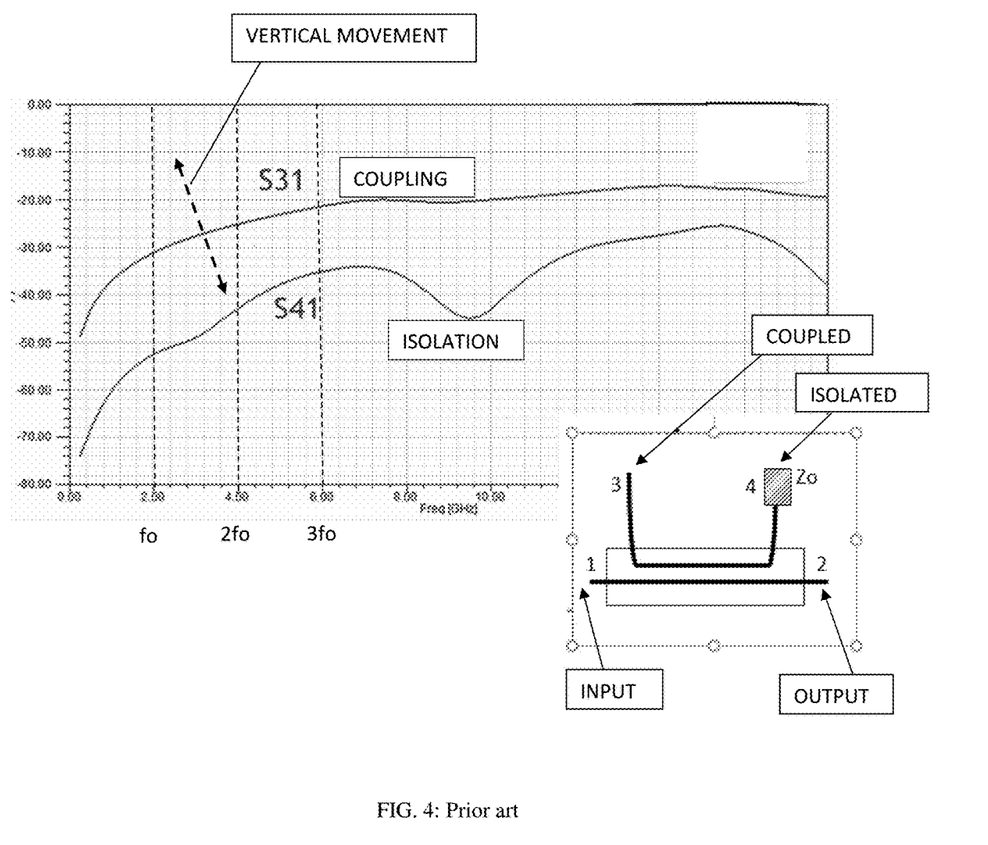
FIG. 4 depicts prior art, measured coupling (S31) and isolation (S32) of a wave-probe, showing higher coupling at harmonic frequencies, and associated port definitions.

The calibration, see FIG. 12, executes as follows: After pre-calibrating the VNA at the desired frequencies (fundamental and any harmonics) the VNA ports are connected using high quality RF cables to the input and test ports of the tuner (FIG. 8); the amplifier is powered on and all probes of the tuner and the coupling loop of the wave-probe are withdrawn from the slabline; the s-parameters are measured and saved in the init matrix [S0] for each harmonic frequency. After that the coupling loop is inserted progressively and moved horizontally in a scheme to cover approximately 360 transmission phase (Φ31=angle of S31) degrees (see insert in FIG. 4) and a range of coupling factors typically between –10 and –30 dB. After that the coupling loop is withdrawn and the tuning probes of the slide screw tuner are inserted alternatively into the slabline and moved horizontally, the stationary probes remaining withdrawn, and s-parameters are measured, cascaded with $[S0]^{-1}$ and saved. After that all permutations for all probe positions Xt.i, Yt.i of the tuning probe "i" (i=1, 2 or 3) and the coupling loop Xwp, Ywp are cascaded in computer memory and saved in a tuner calibration file. This file contains the s-parameters of the hybrid tuner for any combination of Xt.i, Yt.i, Xwp and Ywp at all harmonic frequencies and can be processed into a complete permutation matrix allowing knowing the exact "small signal" impedance seen by the DUT at all harmonic frequencies and all combinations of tuning probes and wave-probe coupling. This impedance remains valid as long as the amplifier in the feed-forward loop is linear.

As already mentioned the calibration of any active system is only valid, as long as the amplifiers are linear, i.e. as long as their transmission phase and gain are constant as a function of the injected power (FIG. 6). Beyond this power limit the calibration becomes invalid and, for the source tuner, there is no way to recover the information. The impedance of the load tuner can be measured "in situ" as shown in FIG. 7; on the load side of the DUT the measurement of <a2> and <b2> yields the exact load reflection factor $\Gamma_{Load}$=<a2>/<b2>, on the source side the measurement of <a1> and <b1> yields the DUT input Gamma $\Gamma_{DUT}$=<b1>/<a1>. In situ impedance measurement is possible only in direction of the signal flow, as dictated by the VNA calibration theory (see ref. 9). Therefore, it is impossible to measure "in situ", i.e. while signal power is injected into the DUT, the source impedance. For the source tune, one must rely on the tuner calibration. Therefore, determining a) the amplifier linearity and b) the actual status of injected power/amplifier linearity during the measurement is inevitable. This can be done, as shown in FIG. 5, using the sampling couplers and the monitoring utility (fixed coupler 50 plus power monitor). The sampling couplers may not be identical. To enhance accuracy by compensating the detected power levels, the output sampling coupler may have lower coupling factor, since the power is higher at the output of the amplifier, this way the VNA, measuring the transmission factor S21, operates in a more balanced (and accurate) condition.

Figure 9:
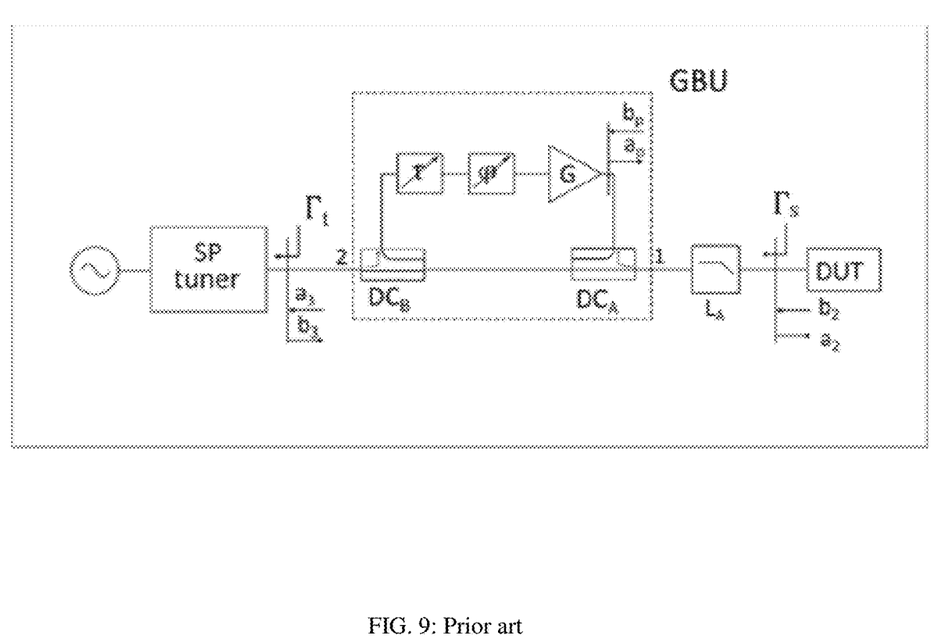
FIG. 9 depicts prior art, the source Gamma Boosting Unit (see ref. 6).
Figure 12:
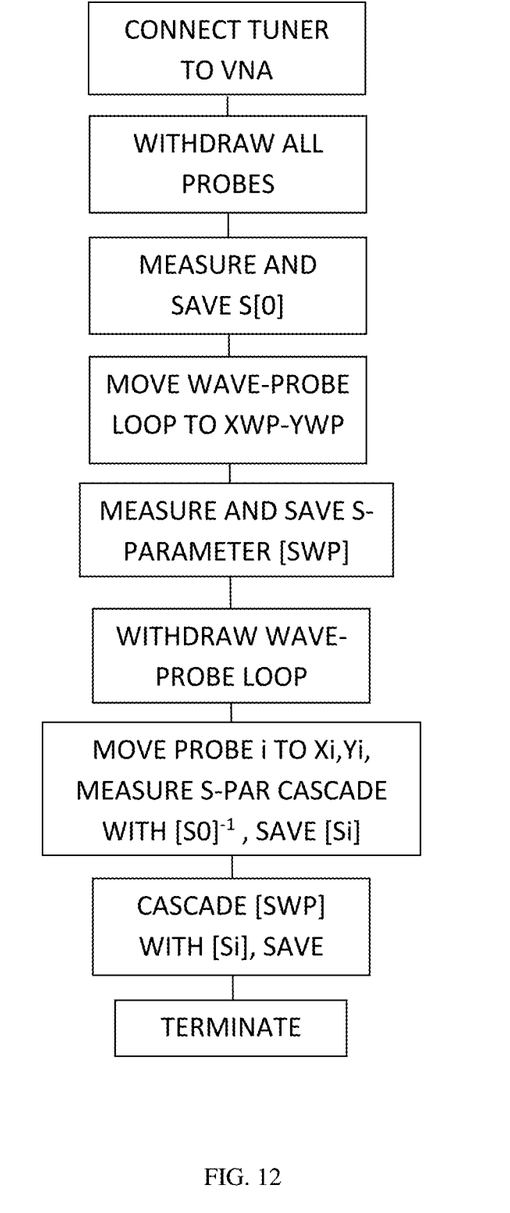
FIG. 12 depicts tuner calibration flowchart

It is stated in ref. 6 column 5 lines 47-53 that the output (load) Gamma Boosting Unit (GBU) can be used at the input (source) as well, as shown here in FIG. 9 and FIG. 12 in ref. 6; the configuration of FIG. 12 (see ref. 6) is useful for enhancing the reflection factor seen by the DUT, but it cannot serve as a source pull tuner, it can serve as a hybrid Gamma (Γ) enhancing tuner, but not for source pull (i.e. for investigating the effect of the source impedance on the DUT performance). Source pull requires knowledge of the specific source impedance, same as load pull requires knowledge of the specific load impedance seen by the DUT and the response of the DUT, not only the response of the DUT. This is the difference between manual power matching and automatic pre-calibrated tuning; the tuner hardware alone, without the appropriate algorithms and control and tuning firmware, is simply necessary, but not sufficient, mechanical gear; load and source pulling capability (calibration and tuning algorithms in control software) is an important part for the utility of the gear. In advanced test equipment, and most other modern machinery, control software (the brain) and hardware (the body) cannot be separated. The GBU of ref. 6 on the source side (FIG. 9) without being able to provide the generated impedance, even as shown in FIG. 7, is meaningless. In fact, as stated before, even the extended setup of FIG. 7 does not allow measuring $\Gamma_S$; the source impedance (reflection factor) can only be retrieved from previous valid tuner calibration and this, in an active or hybrid system, is only true if the amplifier stays linear. Thus, the requirement for an additional linearity calibration step.

Figure 13:
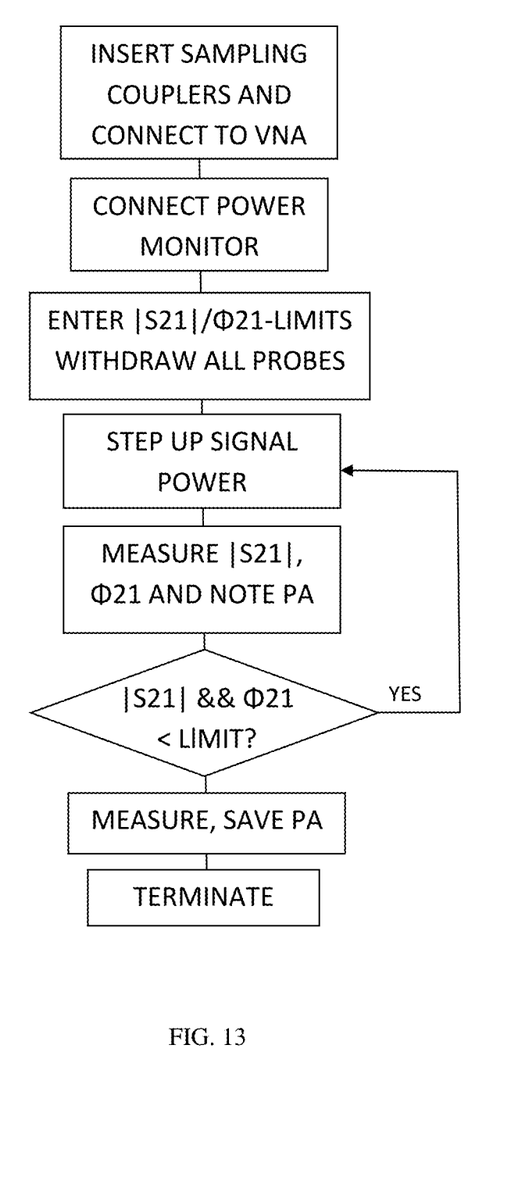
FIG. 13 depicts linearity limit measurement flowchart.

The linearity calibration, FIG. 13, serves in establishing the maximum power level at the input of the amplifier maintaining the validity of the calibration and is executed only at the fundamental frequency fo, because this is where the maximum signal power is. The criterion for linearity depends on the type of amplifier, the presence of harmonic components and relevant user experience for determining the threshold value. The setup and control software must provide for a user-defined linearity criterion. It is measured using the setup of FIG. 5: The control computer communicates with the VNA, the power monitor and the signal source and runs a routine, whereby the source signal power is increased gradually and the amplifier transmission amplitude |S21| and phase Φ21 are measured and evaluated. The tuning probes of the slide screw tuner are withdrawn to allow for maximum power transfer and the wave probe (see ref. 7) is set to maximum coupling for the same reason. The impedance seen into the coupled port of the wave-probe and the injection coupler is approximately a constant 50Ω, which is important to allow for valid linearity characterization of the amplifier. When the signal power for the linearity limit is reached, the associated value is read at the power monitor and saved. All these measurements are relative. In subsequent source or load pull operations the power monitor is read before any data are saved, compared with the saved limit value and allowed or discarded considering the linearity limit of the amplifier.

This application discloses the concept of a hybrid single frequency or harmonic source pull tuner system including an active-passive tuner and its linear calibration. Obvious alternatives shall not impede on the originality of the concept.

What I claim as my invention is:

1. A hybrid harmonic source pull tuner, having an input port and a test port, comprises a cascade of a passive tuning section and an active signal feedforward section;
   wherein
      the passive tuning section comprises
         a slide screw tuner with an input port connected with the input port of the harmonic source pull tuner, an output port connected with the test port of the harmonic source pull tuner, a slabline between the slide screw tuner ports and at least one tuning probe;
   and wherein
      the active signal feedforward section comprises an amplifier connected in parallel with a cascade of two directional signal couplers, an adjustable signal coupler and a fixed signal coupler, each said signal coupler having an input, an output, a coupled and an isolated port and both being integrated in the slabline of the slide screw tuner;
   and wherein
      the signal couplers are connected back-to-back, the output port of the adjustable signal coupler being connected to the input port of the fixed signal coupler;
   and wherein
      an input port of the amplifier is connected to the coupled port of the adjustable signal coupler, wherein said coupled port is located between the at least one tuning probe and the fixed signal coupler, and an output port of the amplifier is connected to the coupled port of the fixed signal coupler, which said coupled port is located next to the output port of the slide screw tuner.

2. The hybrid harmonic source pull tuner of claim 1, wherein
   the slide screw tuner comprises:
      N≥1 remotely controlled mobile carriage(s), sliding along the slabline, each said mobile carriage including a remotely controlled vertical axis mechanism, on which is attached an associated reflective tuning probe which is insertable into a slot of the slabline.

3. The hybrid harmonic source pull tuner of claim 2, wherein
   the adjustable directional signal coupler includes an electro-magnetic coupling loop,
   which is remotely movable along and insertable into the slot of the slabline; and wherein
   the fixed directional signal coupler includes a fixed electro-magnetic coupling loop inserted into the slot of the slabline.

4. The hybrid harmonic source pull tuner of claim 3, wherein
   the electro-magnetic coupling loop of the adjustable directional signal coupler is attached to a remotely controlled vertical axis mechanism of the remotely controlled mobile carriage sliding along the slabline.

5. A calibration method performed using the hybrid harmonic source pull tuner of claim 4 at a frequency Fo and a number of harmonic frequencies N×Fo comprising:
   a) connect a pre-calibrated Vector Network Analyzer between the input port and the test port of the hybrid source pull tuner;
   b) withdraw all tuning probes and the electro-magnetic coupling loop of the adjustable directional signal coupler from the slabline;
   c) measure s-parameters of the hybrid harmonic source pull tuner at all frequencies N×Fo and save in an initialization matrix;
   d) in a first control loop:
      move the tuning probe, which is closest to the input port of the slide screw tuner, to a multitude of positions along and perpendicular to the slabline, measure s-parameters of the hybrid harmonic source pull tuner and save;
   e) withdraw the tuning probe, which is closest to the input port of the slide screw tuner;
   f) if N>1:
      in a series of N−1 control loops:
         move each tuning probe, except the tuning probe of step d), to a multitude of positions along and perpendicular to the slabline, the remaining tuning probes remaining withdrawn, measure s-parameters of the hybrid harmonic source pull tuner at all frequencies N×Fo and save;
   g) withdraw all tuning probes from the slabline;
   h) in a last control loop
      move the electro-magnetic coupling loop of the adjustable directional signal coupler to a multitude of positions along and perpendicular to the slabline, measure s-parameters of the hybrid harmonic source pull tuner at all frequencies N×Fo and save;
   i) cascade the s-parameters of steps f) and h) with the invers of the initialization matrix $[S0(NFo)]^{-1}$ and save;
   j) cascade all permutations of s-parameters acquired in steps d) and i) and save in a tuner calibration file.

* * * * *